United States Patent [19]

Hsu et al.

[11] Patent Number: 5,756,964
[45] Date of Patent: May 26, 1998

[54] THERMAL PROCESSING APPARATUS

[75] Inventors: Chih-Hsien Hsu, Taipei Hsien; Wen Jye Chung, Hsinchu, both of Taiwan

[73] Assignee: Taiwan Semiconductor Manufacturing Company, Ltd., Taiwan

[21] Appl. No.: 823,363

[22] Filed: Mar. 24, 1997

[30] Foreign Application Priority Data

Jan. 23, 1997 [TW] Taiwan .................. 86201187

[51] Int. Cl.$^6$ .................. F27B 1/28; F27B 5/18
[52] U.S. Cl. .................. 219/392; 219/390; 219/158; 392/418; 414/148; 414/161; 118/728
[58] Field of Search .................. 219/392, 158, 219/161, 390, 405, 411; 392/416, 418; 414/147, 148, 160, 161; 118/724, 725, 728–730, 50.1; 165/58, 61; 427/557, 559, 585, 587, 592, 593; 432/121, 122, 152

[56] References Cited

U.S. PATENT DOCUMENTS

| | | | |
|---|---|---|---|
| 4,008,815 | 2/1977 | Fisk | 414/161 |
| 5,436,790 | 7/1995 | Blake et al. | 361/234 |
| 5,670,066 | 9/1997 | Barnes et al. | 219/121.58 |

FOREIGN PATENT DOCUMENTS

| | | |
|---|---|---|
| 61-222233 | 10/1986 | Japan . |
| 6-177141 | 6/1994 | Japan . |

*Primary Examiner*—Teresa J. Walberg
*Assistant Examiner*—J. Pelham
*Attorney, Agent, or Firm*—Cushman Darby & Cushman IP Group of Pillsbury Madison & Sutro LLP

[57] ABSTRACT

A thermal processing apparatus for processing a wafer is disclosed. The thermal processing apparatus includes a thermal processing plate, a plurality of spacers, a plurality of locators, and a plurality of sensors. The temperature of the thermal processing plate is controlled within a predetermined range. The spacers are arranged over the thermal processing plate for supporting the wafer, thereby forming a gap between the wafer and the thermal processing plate. The locators, each of which is disposed over one of the spacers, are provided for locating the wafer. The sensors, each of which is disposed over one of the locators, are provided for detecting the position of the wafer.

8 Claims, 6 Drawing Sheets

THERMAL PROCESSING APPARATUS

BACKGROUND OF THE INVENTION

1. Field of the Invention

The present invention relates in general to semiconductor manufacturing. More specifically, it relates to thermal processing apparatus for thermal processing a wafer on which a uniform photoresist layer has been formed.

2. Description of Related Art

The photoresist utilized in photolithography is a liquid material which, in general includes resin, sensitizer and solvent. A silicon wafer coated with a photoresist layer must be soft baked (or pre-baked) so that the solvent in the photoresist layer can be vaporized and expelled, thus facilitating other photolithography steps, such as an exposing step. The silicon wafer is soft baked using a thermal processing apparatus which typically includes a hot plate. For example, if the hot plate is controlled so that its temperature is in the range of 90°–120° C. for about one minute, the solvent contained in the photoresist will be reduced about 5–20%, and the thickness of the photoresist layer will consequently be reduced 10–20%. The baked silicon wafer is then cooled using another thermal processing apparatus such as a cold plate.

FIG. 1 (Prior Art) shows a conventional thermal processing apparatus, which is provided for heating a photoresist-covered silicon wafer 1. It includes a substrate 10, a thermal processing plate 12, a plurality of spacers 14 and a plurality of locators 16. The substrate 10 provides heat to the thermal processing plate 12 using heaters and a temperature controller (not shown), thereby maintaining the thermal processing plate 12 at a temperature of about 90°–120° C. The thermal processing plate 12 is a metal plate. Therefore, the temperature of the plate 12 can be easily controlled within the acceptable range by the temperature controller and heaters.

Six (6) spacers 14 are arranged over the thermal processing plate 12 to provide a predetermined space between the wafer 1 and the thermal processing plate 12. Moreover, six (6) locators 16 are each established over one of the six spacers 14 for locating the wafer 1 in its predetermined position.

A cross-sectional view of the wafer 1 and the thermal processing apparatus is shown in FIG. 2 (Prior Art). The wafer 1 can be placed horizontally in the predetermined position by using locators 14 as guides.

The configurations of the photoresist layer over the silicon wafer 1, in the soft baking step and cooling step, are illustrated in FIG. 3 (Prior Art) and FIG. 4 (Prior Art), respectively. Referring to FIG. 3 (Prior Art), when the silicon wafer 1 is placed appropriately over the hot plate 14, the photoresist layer having a mean thickness of 8697A has a maximal thickness variation of about 15.5A. For the silicon wafer over a cold plate, as shown in FIG. 4 (Prior Art), the thickness variation of the photoresist layer is within 22.6A.

However, if, as shown in FIG. 5 (Prior Art), the silicon wafer 1 is not placed in the predetermined position, some of the locators 14 will raise one side of the silicon wafer 1, thus providing a non-horizontal wafer surface. The photoresist layer under this situation will have a thickness variation of 160.0A for soft baking, and a variation of 161.2A for cooling. Therefore, the succeeding photolithography steps can not be well carried out, thus diminishing productivity.

SUMMARY OF THE INVENTION

Accordingly, the present invention provides a thermal processing apparatus for locating a wafer at a appropriate position, thereby facilitating the photolithography process.

The thermal processing apparatus of the invention includes a thermal processing plate, a plurality of spacers, a plurality of locators, and a plurality of sensors. The temperature of the thermal processing plate is controlled within a predetermined range. The spacers are arranged over the thermal processing plate for supporting the wafer, thereby forming a gap between the wafer and the thermal processing plate. The locators, each of which is disposed over one of the spacers, are provided for locating the wafer. The sensors, each of which is disposed over one of the locators, are provided for detecting whether the wafer is out of position. The sensors are arranged in circuit so as to provide some indication, such as an alarm, when the wafer is improperly positioned.

The sensors can be micro-switches or light sensors. Moreover, there can be a substrate for supporting the thermal processing plate.

The aforementioned thermal processing apparatus detects when wafer is not in its proper position so that its position can be corrected. This minimizes the occurrences of photoresist layer over the wafer having a non-uniform thickness, thus facilitating the photolithography process.

DETAILED DESCRIPTION OF THE INVENTION

Figure 1:
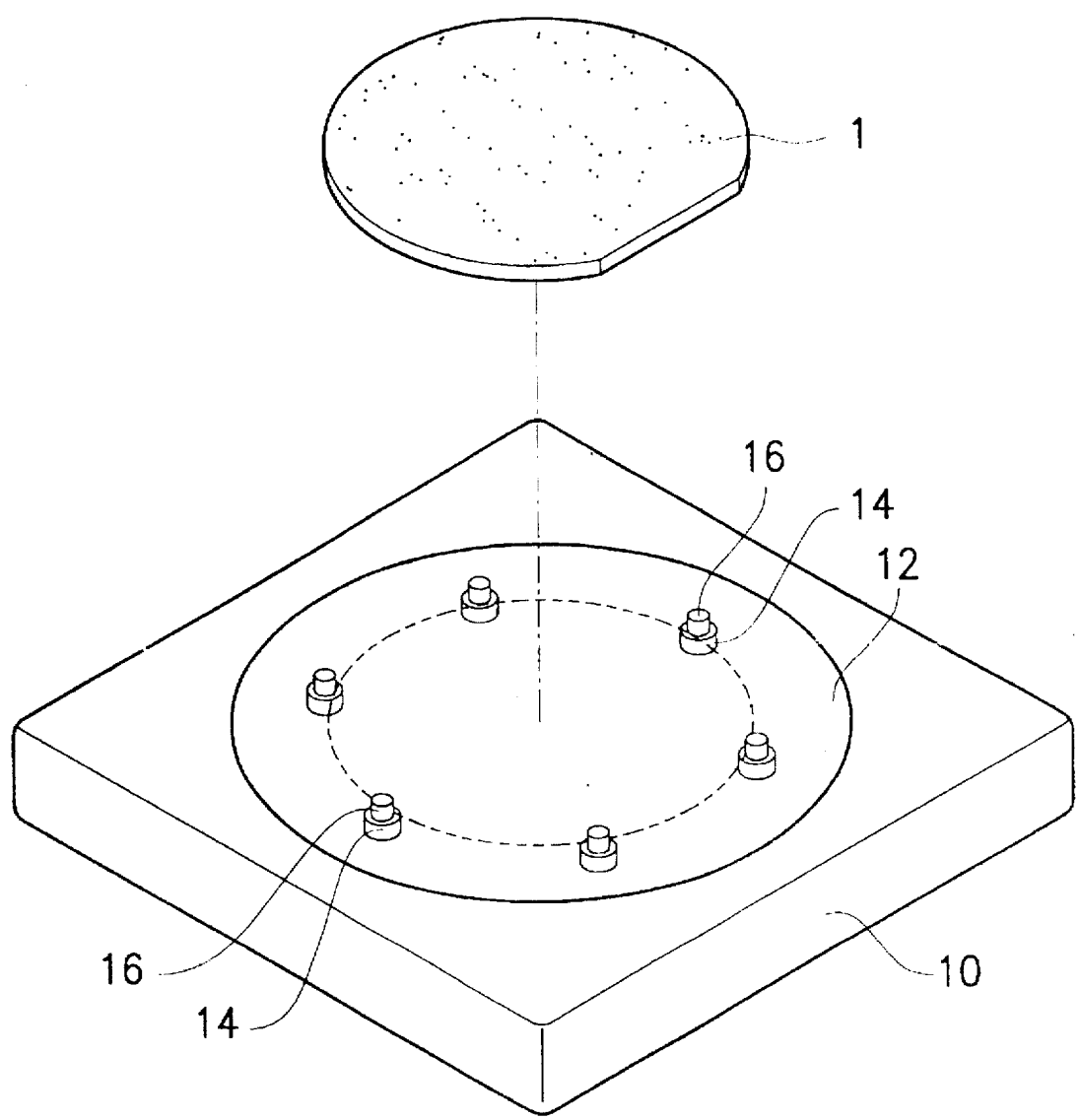
FIG. 1 (Prior Art) is a schematic diagram of a conventional thermal processing apparatus.
Figure 2:
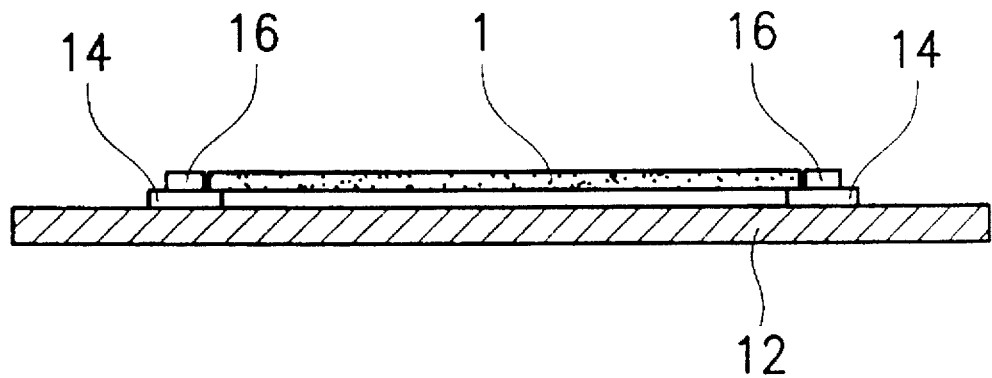
FIG. 2 (Prior Art) is a cross-sectional view of the thermal processing apparatus of FIG. 1 and a wafer which is appropriately placed over the apparatus.
Figure 5:
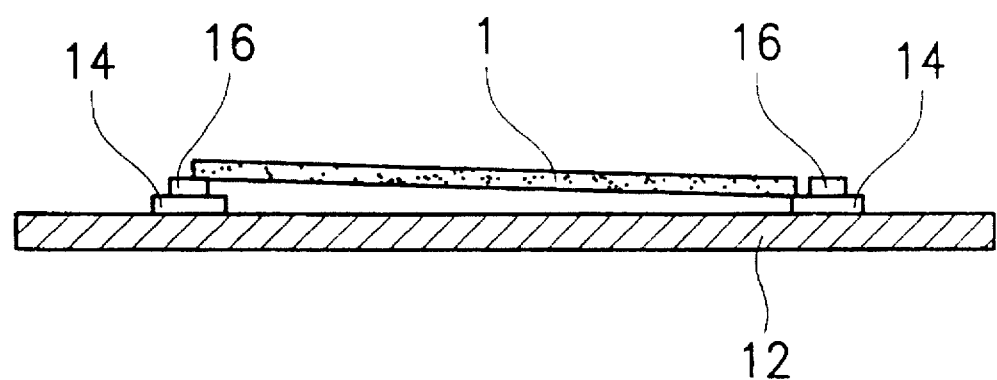
FIG. 5 (Prior Art) is a cross-sectional view illustrating a wafer improperly placed over the thermal processing apparatus of FIG. 1 (Prior Art)
Figure 3:
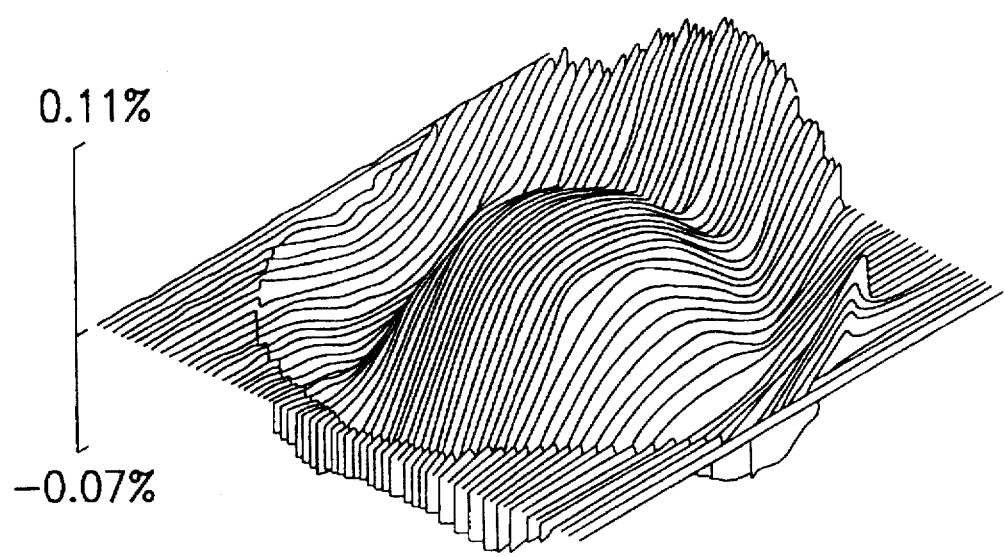
FIG. 3 (Prior Art) illustrates the thickness configuration of a photoresist layer over the wafer of FIG. 2 which is soft baked.
Figure 4:
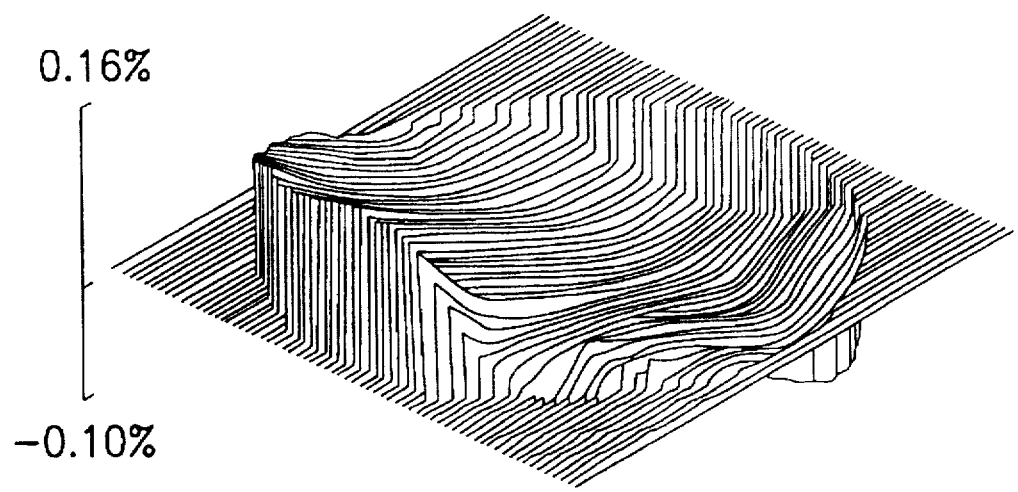
FIG. 4 (Prior Art) illustrates the thickness configuration of a photoresist layer over the wafer of FIG. 2 (Prior Art) which is cooled.
Figure 6:
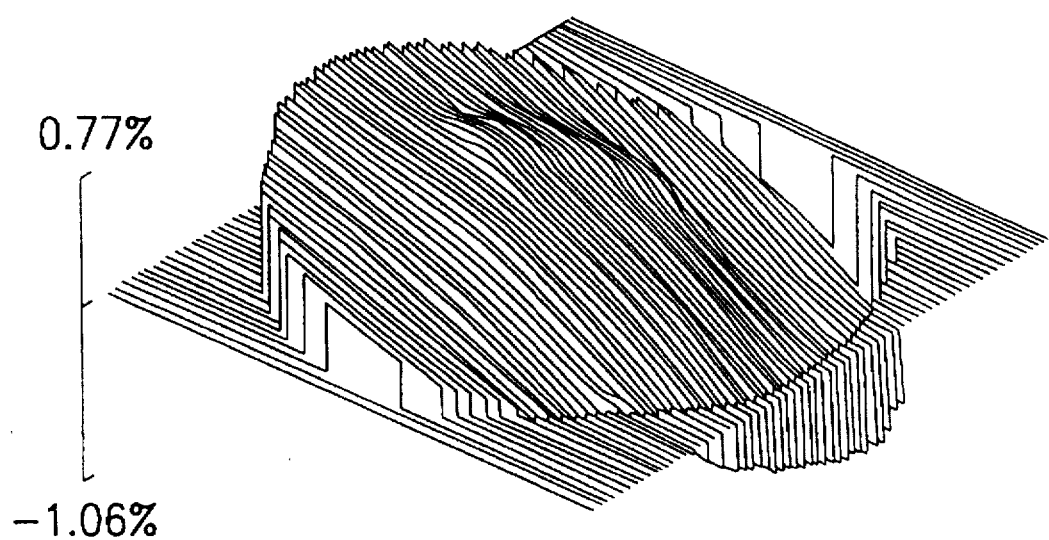
FIG. 6 (Prior Art) illustrates the thickness configuration of a photoresist layer over the wafer of FIG. 5 which is soft baked.
Figure 7:
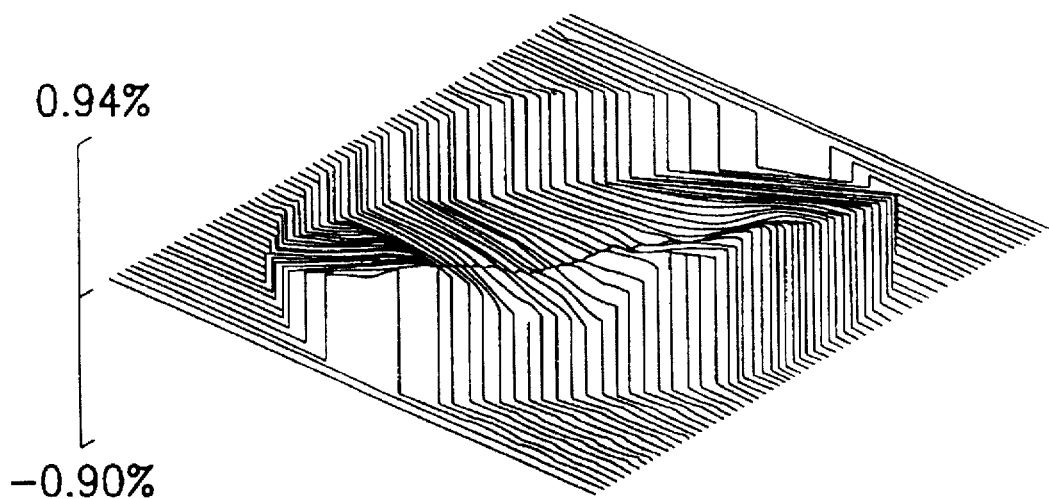
FIG. 7 (Prior Art) illustrates the thickness configuration of a photoresist layer over the wafer of FIG. 5 which is cooled.
Figure 8:
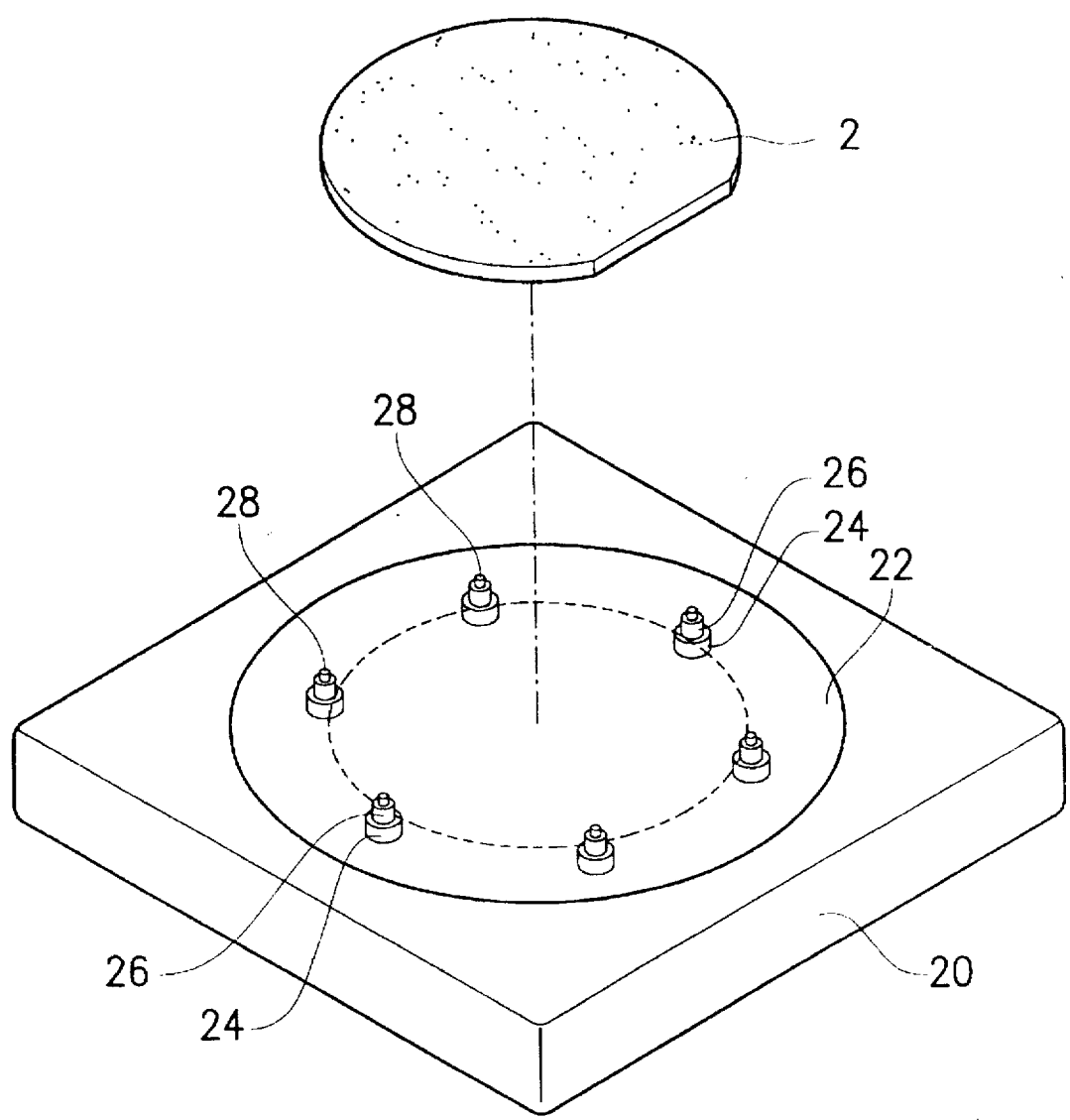
FIG. 8 is a schematic diagram of the thermal processing apparatus of the invention.

The invention provides an apparatus for thermal processing an object, such as a wafer, using a thermal processing plate (a hot or cold plate, for example.) Referring to FIG. 8, the thermal processing apparatus of the embodiment includes a thermal processing plate 22, a plurality of spacers 24, a plurality of locators 26, and a plurality of sensors 28. The thermal processing apparatus is provided for processing a wafer 2.

The thermal processing plate 22 can be a round metal plate. Moreover, there can be a substrate 20 for supporting the thermal processing plate 22. The temperature of the thermal processing plate 22 is controlled by a temperature controller and heaters (not shown in the figure) inside the substrate 20. Therefore, the temperature of the thermal processing plate 22 can be controlled within a predetermined range, which is, for example, about 90°–120° C. for a hot plate.

In the figure, six spacers 24 are shown. However, the invention is not limited to the use of only six (6) spacers. The number can be modified as desired for various wafer sizes and configurations. The spacers 24 are arranged over the thermal processing plate 22 for supporting the wafer 2. Spacers 24 can be of cylindrical shape or some other shape as desired for the wafer configuration. Moreover, there is a gap between the wafer 2 and the thermal processing plate 22 due to the spacers 24. The gap width equals the height of the spacers 24.

Figure 9:
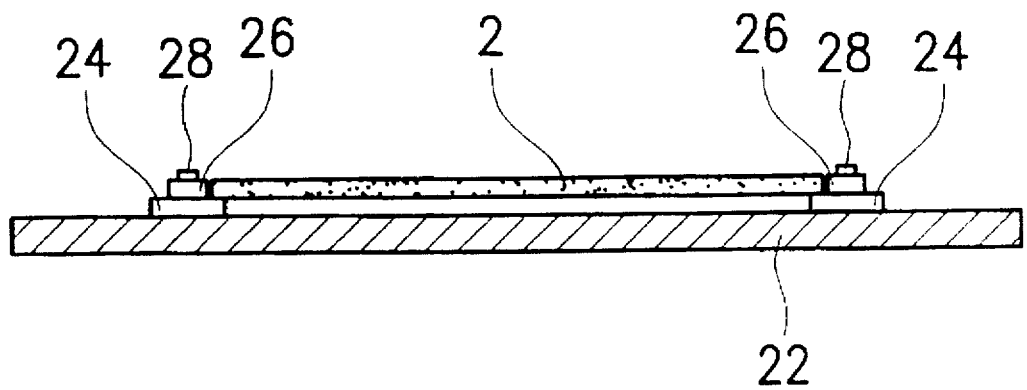
FIG. 9 is a cross-sectional view of the thermal processing apparatus of FIG. 8 over which a wafer is appropriately placed.

Even though six locators 26 are shown in the figure, the number of the locators 26 can be increased or decreased according to that of the spacers 24. The locators 26 are provided to act as guides for disposing the wafer 2 in a predetermined position resting on the spacers 24. The locators 26 can be of cylindrical shape or some other shape for the wafer configuration. FIG. 9 shows wafer 2 placed in the appropriate position with its edges abutting locators 26.

Figure 10:
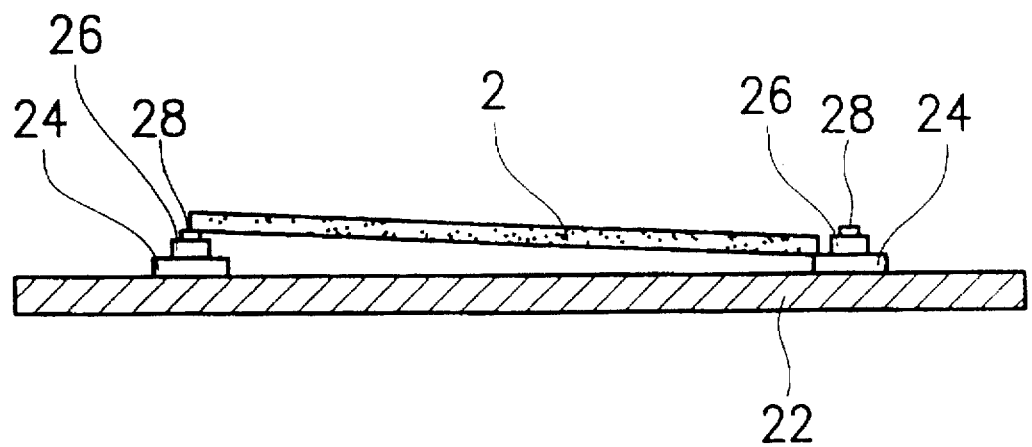
FIG. 10 is a cross-sectional view of the thermal processing apparatus of FIG. 8 over which a wafer is improperly placed.

The sensors 28 can be micro-switches or light sensors. Each of the sensors 28 is located over one of the locators 26. Therefore, if the wafer 2 is not placed in the appropriate position, it can be detected by the sensors 28. FIG. 10 shows wafer 2 improperly placed and covering at least one of the sensors 26. Sensors 26 are arranged so that any sensors that are covered by the wafer 2 trigger an alarm. The position of the wafer can then be modified.

The aforementioned thermal processing apparatus detects the position of the wafer by means of the sensors 26. The wafer must be in its appropriate position, or the sensors will alarm. The invention therefore prevents inadvertent horizontal mis-alignment of the wafer, thereby allowing the thermal process to apply heat uniformly to the wafer so as retain uniform thickness of the photoresist layer on the wafer.

What is claimed is:

1. An apparatus for thermal processing a wafer, comprising:
    a thermal processing plate whose temperature is controlled so as to be within a predetermined range;
    a plurality of spacers for supporting the wafer over the thermal processing plate and forming a gap between the wafer and the thermal processing plate;
    a plurality of locators, each of which is over one of the spacers, for locating the wafer; and
    a plurality of sensors, each of which is provided over one of the locators, for detecting the position of the wafer, each sensor being so arranged as to provide an indication when the wafer is not properly positioned.

2. The apparatus as claimed in claim 1, wherein the sensors are micro-switches.

3. The apparatus as claimed in claim 1, wherein the sensors are light sensors.

4. The apparatus as claimed in claim 1 further comprising a substrate which is covered with the thermal processing plate.

5. The apparatus as claimed in claim 1, wherein the wafer is a silicon wafer.

6. The apparatus as claimed in claim 1, wherein the spacers and the locators form six gap pins over the thermal processing plate.

7. The apparatus as claimed in claim 1, wherein the spacers and the locators are cylinders.

8. The apparatus as claimed in claim 1, wherein the thermal processing plate is a metal plate.

* * * * *